(12) United States Patent
Beulens et al.

(10) Patent No.: US 7,092,287 B2
(45) Date of Patent: Aug. 15, 2006

(54) METHOD OF FABRICATING SILICON NITRIDE NANODOTS

(75) Inventors: Jacobus Johannes Beulens, Scottsdale, AZ (US); Yuet Mei Wan, Leuven (BE)

(73) Assignee: ASM International N.V., Bilthoven (NL)

( * ) Notice: Subject to any disclaimer, the term of this patent is extended or adjusted under 35 U.S.C. 154(b) by 213 days.

(21) Appl. No.: 10/739,901

(22) Filed: Dec. 17, 2003

(65) Prior Publication Data

US 2004/0224534 A1    Nov. 11, 2004

Related U.S. Application Data

(60) Provisional application No. 60/435,314, filed on Dec. 18, 2002.

(51) Int. Cl.
- *G11C 16/00* (2006.01)
- *H01L 21/336* (2006.01)
- *H01L 21/31* (2006.01)

(52) U.S. Cl. ............... 365/185.01; 438/257; 438/775; 977/DIG. 1

(58) Field of Classification Search ........ 438/257, 438/260, 769, 775–777; 257/314–317; 365/185.01, 184; 977/DIG. 1

See application file for complete search history.

(56) References Cited

U.S. PATENT DOCUMENTS

| | | | |
|---|---|---|---|
| 4,262,631 A | 4/1981 | Kubacki |
| 4,277,320 A | 7/1981 | Beguwala et al. |
| 4,298,629 A | 11/1981 | Nozaki et al. |
| 4,363,828 A | 12/1982 | Brodsky et al. |
| 4,495,218 A | 1/1985 | Azuma et al. |
| 4,585,671 A | 4/1986 | Kitagawa et al. |
| 4,684,542 A | 8/1987 | Jasinski et al. |
| 4,715,937 A | 12/1987 | Moslehi et al. |
| 4,834,020 A | 5/1989 | Bartholomew |
| 4,851,095 A | 7/1989 | Scobey et al. |
| 5,112,773 A | 5/1992 | Tuttle |
| 5,227,329 A | 7/1993 | Kobayashi et al. |
| 5,389,398 A | 2/1995 | Suzuki et al. |
| 5,389,570 A | 2/1995 | Shiozawa |
| 5,418,180 A | 5/1995 | Brown |
| 5,453,858 A | 9/1995 | Yamazaki |
| 5,607,724 A | 3/1997 | Beinglass et al. |
| 5,612,558 A | 3/1997 | Harshfield |
| 5,614,257 A | 3/1997 | Beinglass et al. |
| 5,648,293 A | 7/1997 | Hayama et al. |
| 5,656,531 A | 8/1997 | Thakur et al. |

(Continued)

FOREIGN PATENT DOCUMENTS

EP    1 104 012 A1    5/2001

(Continued)

OTHER PUBLICATIONS

Tiwari et al., "Volatile and Non-Volatile Memories in Silicon with Nano-Crystal Storage," Dec. 1995, International Electron Devices Meeting, pp. 521-524.*

(Continued)

*Primary Examiner*—Evan Pert
(74) *Attorney, Agent, or Firm*—Knobbe Martens Olson & Bear LLP

(57) ABSTRACT

A method of forming silicon nitride nanodots that comprises the steps of forming silicon nanodots and then nitriding the silicon nanodots by exposing them to a nitrogen containing gas. Silicon nanodots were formed by low pressure chemical vapor deposition. Nitriding of the silicon nanodots was performed by exposing them to nitrogen radicals formed in a microwave radical generator, using $N_2$ as the source gas.

33 Claims, 4 Drawing Sheets

U.S. PATENT DOCUMENTS

| | | | |
|---|---|---|---|
| 5,695,819 | A | 12/1997 | Beinglass et al. |
| 5,698,771 | A | 12/1997 | Shields et al. |
| 5,700,520 | A | 12/1997 | Beinglass et al. |
| 5,714,766 | A | 2/1998 | Chen et al. |
| 5,786,027 | A | 7/1998 | Rolfson |
| 5,789,030 | A | 8/1998 | Rolfson |
| 5,837,580 | A | 11/1998 | Thakur et al. |
| 5,874,129 | A | 2/1999 | Beinglass et al. |
| 5,876,797 | A | 3/1999 | Beinglass et al. |
| 5,885,869 | A | 3/1999 | Turner et al. |
| 5,907,792 | A | 5/1999 | Droopad et al. |
| 5,916,365 | A | 6/1999 | Sherman |
| 6,015,590 | A | 1/2000 | Suntola et al. |
| 6,027,705 | A | 2/2000 | Kitsuno et al. |
| 6,083,810 | A | 7/2000 | Obeng et al. |
| 6,087,229 | A | 7/2000 | Aronowitz et al. |
| 6,136,654 | A | 10/2000 | Kraft et al. |
| 6,159,828 | A | 12/2000 | Ping et al. |
| 6,165,842 | A | 12/2000 | Shin et al. |
| 6,171,662 | B1 | 1/2001 | Nakao |
| 6,197,669 | B1 | 3/2001 | Twu et al. |
| 6,197,694 | B1 | 3/2001 | Beinglass |
| 6,200,893 | B1 | 3/2001 | Sneh |
| 6,228,181 | B1 | 5/2001 | Yamamoto et al. |
| 6,252,295 | B1 | 6/2001 | Cote et al. |
| 6,271,054 | B1 | 8/2001 | Ballantine et al. |
| 6,326,311 | B1 | 12/2001 | Ueda et al. |
| 6,391,803 | B1 | 5/2002 | Kim et al. |
| 6,455,892 | B1 | 9/2002 | Okuno et al. |
| 6,468,924 | B1 | 10/2002 | Lee et al. |
| 6,503,846 | B1 | 1/2003 | Niimi et al. |
| 6,528,530 | B1 | 3/2003 | Zeitlin et al. |
| 6,537,910 | B1 | 3/2003 | Burke et al. |
| 6,613,695 | B1 | 9/2003 | Pomarede et al. |
| 6,638,879 | B1 | 10/2003 | Hsieh et al. |
| 6,724,038 | B1 * | 4/2004 | Mikolajick .................. 257/324 |
| 6,831,315 | B1 * | 12/2004 | Raaijmakers et al. ....... 257/296 |
| 2002/0047151 | A1 | 4/2002 | Kim et al. |
| 2002/0073925 | A1 | 6/2002 | Noble et al. |
| 2002/0098627 | A1 | 7/2002 | Pomerede et al. |
| 2002/0168868 | A1 | 11/2002 | Todd |
| 2002/0197831 | A1 | 12/2002 | Todd et al. |
| 2003/0022528 | A1 | 1/2003 | Todd |
| 2003/0059535 | A1 | 3/2003 | Luo et al. |
| 2003/0082300 | A1 | 5/2003 | Todd et al. |

FOREIGN PATENT DOCUMENTS

| | | | |
|---|---|---|---|
| JP | 57209810 | A | 12/1982 |
| JP | 59078918 | A | 5/1984 |
| JP | 59078919 | A | 5/1984 |
| JP | 60043485 | A | 3/1985 |
| JP | S60-43485 | | 3/1985 |
| JP | 61153277 | A | 7/1986 |
| JP | 62076612 | A | 4/1987 |
| JP | 63003414 | A | 1/1988 |
| JP | 63003463 | A | 1/1988 |
| JP | 01217956 | A | 8/1989 |
| JP | 01268064 | A | 10/1989 |
| JP | 02155225 | A | 6/1990 |
| JP | H 02-155225 | | 6/1990 |
| JP | 03091239 | A | 4/1991 |
| JP | H3-91239 | | 4/1991 |
| JP | 03185817 | A | 8/1991 |
| JP | 03187215 | A | 8/1991 |
| JP | H3-185817 | | 8/1991 |
| JP | H3-187215 | | 8/1991 |
| JP | 03292741 | A | 12/1991 |
| JP | 04323834 | A | 11/1992 |
| JP | 05021378 | A | 1/1993 |
| JP | 05062911 | A | 3/1993 |
| JP | 07249618 | A | 9/1995 |
| JP | 08242006 | A | 9/1996 |

OTHER PUBLICATIONS

Ohba et al., "Influence of Channel Depletion on the Carrier Charging Characteristics in Si Nanocrystal Floating Gate Memory," Mar. 2000, Jpn J Appl Phys Part 1 (2000) vol. 39, No. 3A, pp. 989-993.*

Ohba et al., "Non-Volatile Si Quantum Memory with Self-Aligned Doubly-Stacked Dots," Dec. 2000, IEDM Technical Digest, pp. 313-316.*

Baron et al. "Low pressure chemical vapor deposition growth of silicon quantum dots on insulator for nanoelectronics devices," Applied Surface Science, 164:29-34 (2000).

Koga et al. "Silicon Single-Electron Memory & Logic Devices for Room Temperature Operation," IEDM, 143-147 (2001).

Ikoma et al., Growth of Si/3C-SiC/Si(100) hetrostructures by pulsed supersonic free jets, Applied Physics Letters, vol. 75, No. 25, pp. 3977-3979, Dec. 1999.

Iyer, R. Suryanarayanan et al., "A process Method of Silicon Nitride Atomic Layer Cyclic Deposition," Semicon Taiwan 2001, pp. 17-25.

Watanabe, An Advanced Technique for Fabricating Hemispherical-Grained (HSG) Silicon Storage Electrodes, *Transactions on Electron Devices*, vol. 42, No. 2, Feb. 1995.

\* cited by examiner

METHOD OF FABRICATING SILICON NITRIDE NANODOTS

RELATED APPLICATION

This application claims the priority benefit under 35 U.S.C. § 119(e) of Provisional Application No. 60/435,314, filed Dec. 18, 2002.

FIELD OF THE INVENTION

The invention relates generally to the field of semiconductor manufacturing and more particularly to the fabrication of SiN nanodots in non-volatile memory devices.

BACKGROUND OF THE INVENTION

The size of semiconductor memory devices, and the thin dielectric films that comprise these devices, has been scaled down over the past years in order to fulfill the requirements of diminishing feature size. Further scaling down presents serious problems. One large problem, in floating gate memory devices, is that the charge retention characteristics of the devices are very sensitive to the presence or absence of defects in the tunnel oxide. A reduction in the thickness of the tunnel oxide, to allow for further scaling down, increases the risk of defects occurring in the tunnel oxide.

One partial solution to this problem is to store the charge in a floating gate comprised of a plurality of nanodots, instead of a monolithic floating gate. This plurality strongly reduces the sensitivity of the device to incidental defects in the tunnel oxide. In such a situation, when a defect is present, a nanodot immediately adjacent the defect might lose its charge but the other nanodots are not affected. See, e.g., U.S. Pat. No. 6,165,842 to Shin et al., issued Dec. 26, 2000; U.S. Pat. No. 5,714,766 to Chen et al., issued Feb. 3, 1998.

Nanodots made from silicon have been useful in making such gates. In recent years, a significant amount of research has been done in the area of silicon nanodots. Silicon nanodots are generally produced by low pressure chemical vapor deposition (LPCVD) and the process conditions can be readily optimized to produce silicon nanodots of a desired size and with a desired density. See, e.g., Baron et al., "Low pressure chemical vapor deposition growth of silicon quantum dots on insulators for nanoelectronic devices," *APPLIED SURFACE SCIENCE*, Vol. 164, pp. 29–34 (2000).

More recently, one group has investigated the option of blended, or heterogeneous, silicon nitride nanodots. See, e.g., Koga et al., "Silicon Single-Electron Memory and Logic Devices For Room Temperature Operation," *IEDM* 01–143, pp. 7.1.1–7.1.4 (2001). Silicon nitride nanodot devices show superior memory characteristics over silicon nanodot devices. Data retention characteristics are better and write characteristics show that a large memory window is attainable in each SiN dot device because multiple traps are formed in each SiN dot. Another advantage is that the silicon nitride dots are not as susceptible to oxidation. This can be important, for instance, in the case of a doubly stacked, floating dot memory device, where an upper dot is formed over a silicon layer. In the creation of such a device, the silicon layer is mostly oxidized, except for a lower silicon dot where the lower area is shielded from oxidation in a self-aligned manner by the upper dot. However, when the upper dot is formed of pure silicon, the upper dot will partially oxidize during the process and thus, size control of the lower dot is difficult. Using a silicon nitride dot as the upper dot largely eliminates this problem, as silicon nitride is very resistant to oxidation.

The current practice for the creation of these silicon nitride dots is to use low pressure chemical vapor deposition. However, the manufacturing of silicon nitride dots by low pressure chemical vapor deposition (LPCVD) has several disadvantages. First, the deposition temperature for the silicon nitride LPCVD process is significantly higher than the deposition temperature for the silicon process, resulting in higher consumption of the thermal budget of the wafer, which is undesired. Second, the LPCVD seed conditions that produce SiN nanodots of a desired size and density are largely unknown and still need to be explored. Finally, the visibility of silicon nitride nanodots on a silicon oxide film, either with scanning electron microscopy (SEM) or with transmission electron microscopy (TEM), is rather poor, as compared to the visibility of silicon nanodots, thus making the silicon nitride dots hard to examine.

SUMMARY OF THE EMBODIMENTS

The present embodiments have several advantages, these advantages include avoiding the above disadvantages and providing a method of manufacturing silicon nitride nanodots that can easily be implemented in a production environment.

In accordance with one aspect of the present invention, a method is provided for producing silicon nitride nanodots. Silicon nanodots are produced, followed by nitridation of the silicon nanodots by a nitrogen source gas. According to a preferred embodiment, the silicon nanodots are formed by a chemical vapor deposition (CVD) seed technique. According to a further aspect of the invention, nitridation of the silicon nanodots is carried out by exposing them to nitrogen radicals.

In accordance with another aspect of the invention, a non-volatile memory device is provided. The device comprises a semiconductor substrate and a plurality of silicon nitride nanodots across an area of the substrate. The nanodots have an average size between about 1 nm and 100 nm and cover between about 10% and 50% of the area of the substrate.

In accordance with another embodiment, a non-volatile memory device is disclosed. The device comprises a semiconductor substrate, and a number of nanodots on the substrate, wherein at least some of the nanodots comprise a core region having a nitrogen concentration lower than a surface region of the at least some of the nanodots.

DETAILED DESCRIPTION OF THE INVENTION

Figure 1:
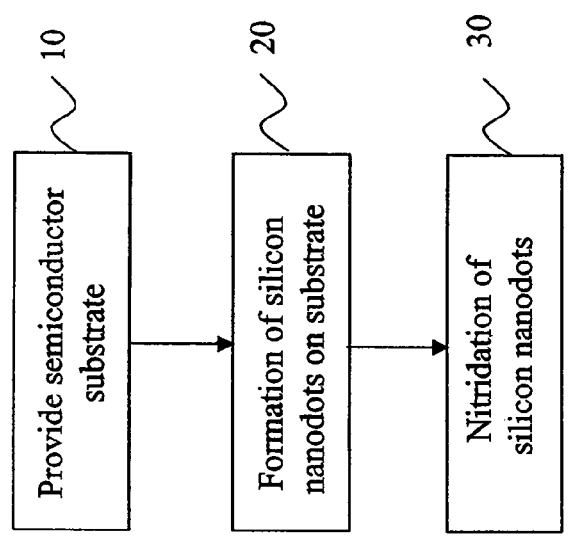
FIG. 1 shows a sequence of process steps to form silicon nitride nanodots in accordance with a preferred embodiment of the invention.

A sequence of process steps according to a preferred embodiment is schematically shown in FIG. 1. In step 10 a semiconductor substrate is provided, preferably a silicon substrate. Typically, the nanodots are formed on a dielectric layer present on the semiconductor substrate. In one embodiment, the dielectric layer can be silicon oxide formed by thermal oxidation of the silicon substrate. However, the dielectric film can also be a silicon oxide film deposited onto the substrate or any other dielectric film deposited on the substrate, such as a high-K dielectric film deposited by chemical vapor deposition (CVD) or atomic layer deposition (ALD). In step 20 silicon nanodots are formed on the substrate. In one embodiment, the silicon nanodots are preferably formed by a low pressure chemical vapor deposition (LPCVD) technique. Any suitable technique, including prior art processes, can be used to form the silicon nanodots. In step 30, the silicon nanodots are nitrided using a nitrogen containing gas. In one embodiment, the nitrogen containing gas comprises atomic nitrogen, such as that produced by a remote radical generator. This step can result in a nitrogen distribution throughout the silicon nitride nanodot that is heterogeneous, at least for some of the nanodots. In particular, surface regions of at least some of the nanodots are more nitrogen-rich than core regions of such heterogeneous nanodots.

Figure 2:
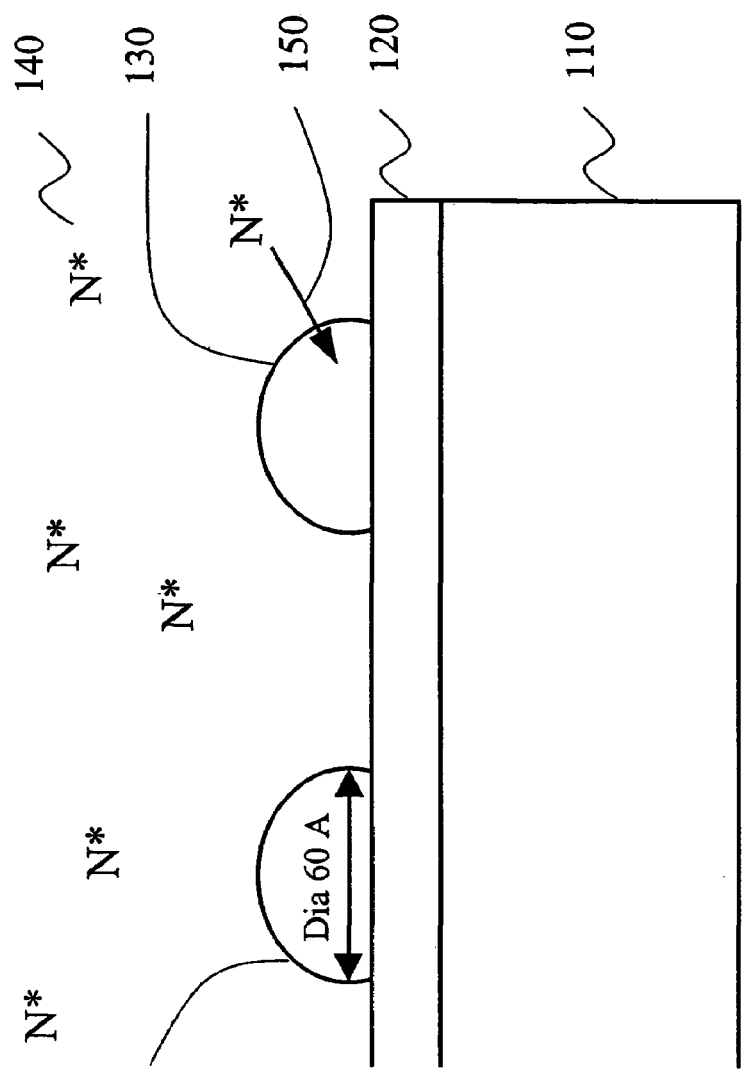
FIG. 2 schematically illustrates a substrate with silicon nanodots being subjected to nitrogen radicals in accordance with a preferred embodiment.

In FIG. 2, the nitridation of silicon nanodots is shown schematically. A substrate 110 is provided with a dielectric layer 120. On top of the dielectric layer 120, silicon nanodots 130 are present. The substrate 110, including the silicon nanodots 130, is exposed to nitrogen radicals 140. In a preferred embodiment, the nitrogen radicals are capable of penetrating the silicon nanodots 130. In a more preferred embodiment, the nitrogen radicals are capable of penetrating the silicon nanodots over a significant depth and converting at least the silicon nanodots substantially entirely to silicon nitride.

Figure 3:
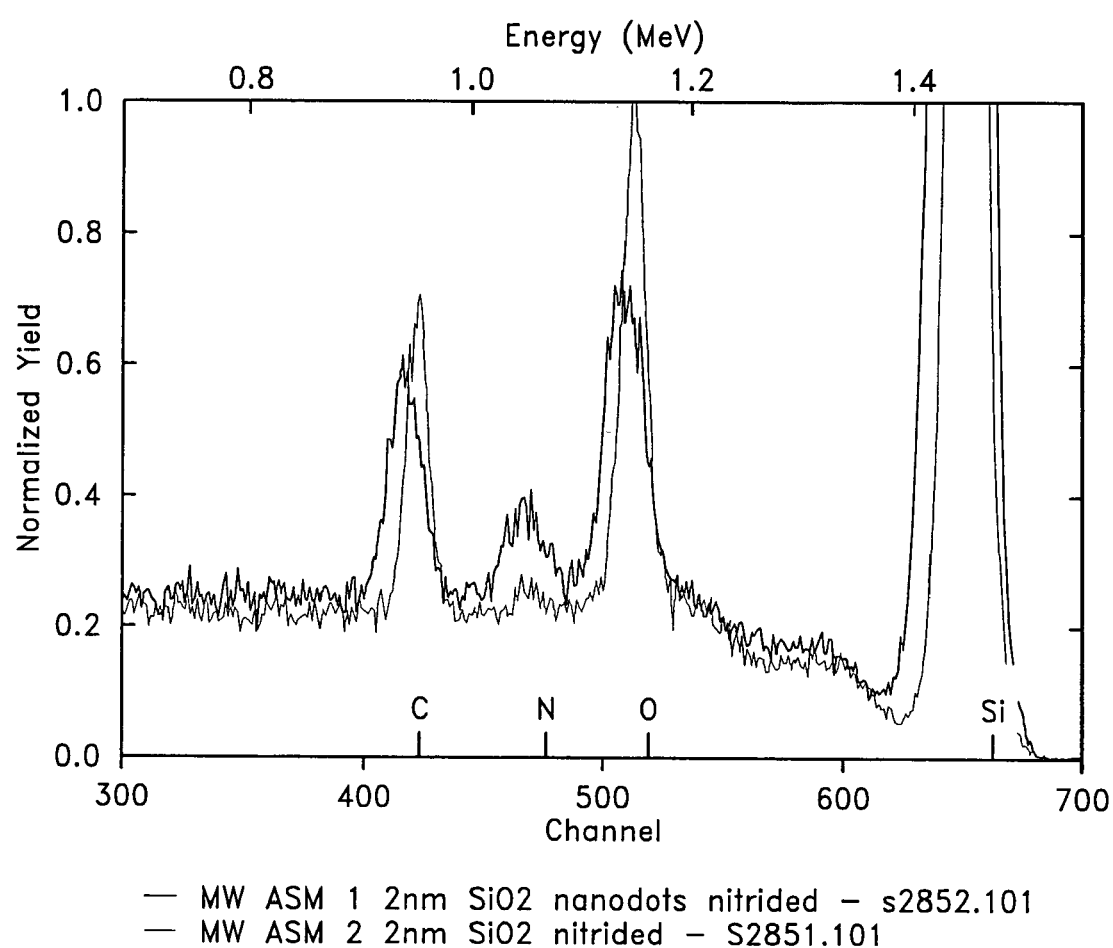
FIG. 3 shows Rutherford backscattering spectrometry (RBS) results on silicon nanodots and blanket oxide after nitridation.

FIG. 3 shows the results of Rutherford backscattering spectroscopy (RBS) on silicon substrates covered with 2 nm of silicon oxide. It will be understood by the skilled artisan that in actual products the nanodots overlie a dielectric layer, which can comprise silicon oxide as employed in the experiments described herein, or can comprise other, higher permittivity ("high k") dielectrics in other examples. For sample 1, comprised of nitrided silicon dots from one embodiment, the result shows a significant nitrogen peak. For sample 2, the blanket silicon oxide film, without silicon nanodots, was exposed to the nitrogen radicals. The result shows an insignificant nitrogen peak. These results show that the nitriding process is effective in converting the silicon nanodots into silicon nitride nanodots while the silicon oxide itself is not significantly nitrided by the process.

In one embodiment, the silicon dots can be formed by the LPCVD seed technique using $SiH_4$ as the source gas. The nanodots for sample 1, in FIG. 3, were made by the LPCVD seed technique, using $SiH_4$ as the source gas. Without intending to be limited by theory, the inventors believe that the formation of the nanodots is as follows. It is known that many surfaces are susceptible to slow nucleation behavior during the first stages of a CVD process. This means that in the first stages of growth, the atoms deposited on a substrate do not form a continuous film, but form a number of discrete nuclei, leaving the surrounding surface area of the substrate uncovered. During the nucleation stage, nuclei continue to grow in size and additional new nuclei are formed. This process continues until the nuclei touch each other; thus, in the end, a continuous film covers the entire surface area. When suitable process conditions are chosen in terms of $SiH_4$, partial pressure, and process temperature, and the process is interrupted in time, a discontinuous layer with a desired density and size of nuclei can be formed that is suitable as a nanodot electrode layer.

The selected temperature for the formation of the nanodots is preferably between 450° C. and 650° C., more preferably between 500° C. and 620° C., and most preferably between 530° C. and 550° C. When relatively high temperatures are selected, polycrystalline nuclei are formed and when relatively low temperatures are selected, amorphous nuclei are formed. The advantage of amorphous nuclei is that their surface topography is smoother. Consequently, the LPCVD seed temperature is preferably selected such that the formed nuclei are amorphous and remain amorphous throughout the entire LPCVD seed stage.

The selected partial pressure of the silicon source gas is preferably between 0.01 mTorr and 1 Torr, more preferably between 1 mTorr and 100 mTorr and even more preferably between 1 mTorr and 10 mTorr. An exemplary partial pressure is between 5 mTorr and 6 mTorr.

The selected silicon source gas flow depends on the size of the system used. For example, for a batch furnace with a load size of about 100 semiconductor substrates of 200 mm diameter, the silicon source gas flow is preferably between about 0.1 sccm and about 1000 sccm, more preferably between about 1 sccm and about 100 sccm, and even more preferably between about 10 and about 30 sccm. It would be a matter of routine operation for one of skill in the art to determine the desired gas flow. Optionally, an inert carrier gas can be used. It will be clear that by the use of an inert carrier gas, such as nitrogen, while keeping the partial pressure of the silicon source gas constant, the process pressure will increase. In one embodiment, the selected inert gas flow is preferably between about 0.1 slm and about 10 slm. The selected silicon source gas exposure time is preferably between about 0.1 min and about 60 min, more preferably between about 0.5 min and about 30 min, and even more preferably between about 1 min and about 15 min.

In one embodiment, the average size or diameter of nanodots formed is preferably in the range of 1 nm to 100 nm, more preferably between 2 nm and 20 nm, and most preferably between 5 nm and 7 nm. Preferably between 10% and 50% of the substrate surface area is covered with the nanodots, more preferably between 20% and 40% and most preferably about 30%. In one embodiment, the nanodots are approximately hemispherical. In one embodiment, monosilane ($SiH_4$) has been found a suitable source gas, although other gases like disilane ($Si_2H_6$) and trisilane ($Si_3H_8$) can alternatively be used. In another embodiment, chlorosilanes ($SiH_xCl_{(4-x)}$, x=0–4) can alternatively be used, although they will give rise to higher process temperatures.

The nitridation is performed by exposure of the silicon nanodots to a nitrogen containing gas such as, but not limited to $N_2$, nitrogen hydrides (e.g., $NH_3$ and $N_2H_4$) and nitrogen halides (e.g., $NF_3$, $NCl_3$ and $NI_3$). In a more preferred embodiment, the nitrogen containing gas comprises nitrogen radicals or atomic nitrogen. Preferably, $N_2$ is used as the source gas for creating the nitrogen radicals. In one embodiment, the nitrogen radicals are generated outside the process chamber, by a nitrogen radical generator in communication with the process chamber.

One advantage of the use of nitrogen radicals, particularly neutral atomic nitrogen, is that they are reactive enough to allow nitridation at temperatures below the crystallization temperature of amorphous silicon, preserving the smooth surface topography of the amorphous film. Thus, the resultant silicon nitride nanodots preferably exhibit a similar smooth topography. This smoothness reduces high field effects at rough edges, effectively increasing the breakdown voltage.

Another advantage is that the fact that known nucleation behavior of silicon LPCVD determines the size and distribution of the nanodots. Advantageously, such conditions are already established in the art and need not be optimized separately for direct silicon nitride deposition, while the advantages of silicon nitride nanodots are nevertheless obtained. This is particularly advantageous because it is difficult to evaluate the distribution of silicon nitride nanodots, since the visibility of silicon nitride is poor with either SEM or TEM technology. Thus, the nanodots have a size and distribution characteristic of the silicon LPCVD, set forth above.

Nitridation of blanket amorphous silicon films by nitrogen radicals resulted in a nitride film thickness of 2.2 nm, as measured by spectroscopic ellipsometry, independent of the nitridation temperature. This indicates that the nitridation process is self-limiting under the preferred conditions, similar to what is known for thermally activated nitridation. The nitridation temperature is preferably selected between 200° C. and 800° C., more preferably between 300° C. and 650° C., and most preferably between 400° C. and 500° C.

In one embodiment, the silicon nanodots are exposed to the nitrogen for 5 seconds or more. In a more preferred embodiment, the silicon nanodots are exposed to nitrogen for 5 seconds to 5 minutes. In a more preferred embodiment, the silicon nanodots are exposed to the nitrogen for greater than 30 seconds, most preferably greater than about 1 minute. In one preferred embodiment, the silicon nitride nanodots are exposed to the nitrogen source until all of the silicon nanodots are converted to silicon nitride.

As will be appreciated by one of skill in the art, the reaction chambers wherein the LPCVD seed process and the nitridation are performed can be of different designs. In the experiments that resulted in the examples presented herein, the LPCVD seed process was performed in a vertical, hot-wall batch furnace designed for a batch size of 150 wafers with a diameter of 200 mm. The nitridation was performed in a cold-wall single wafer reactor operating at atmospheric pressure, and the reactor was provided with a remote nitrogen radical generator. However, both processes can be performed in a single wafer reactor or in a batch reactor. When nitridation is performed in a batch reactor, care should be taken that the radicals live long enough to reach all substrates and all parts of each substrate. The nitridation process can also be performed in-situ, inside the LPCVD reactor, avoiding the need for wafer transport between the two process steps.

EXAMPLE

Synthesis of Nitride Nanodots

Silicon substrates were subjected to an ultra diluted wet oxidation process as described in U.S. patent application Ser. No. 09/723,323 of applicant to form a 2 nm thick layer of oxide. The low pressure chemical vapor deposition "LPCVD" seed process was carried out in a LPCVD vertical furnace from ASM, model A400™-XT, (ASM International N.V., Bilthoven, The Netherlands), designed for 200 mm wafers with a usable load size of 150 wafers. The temperature was 540° C., the pressure 550 mTorr, $SiH_4$ flow 20 sccm, nitrogen carrier flow 1 slm and exposure time 10 min.

Figure 4:
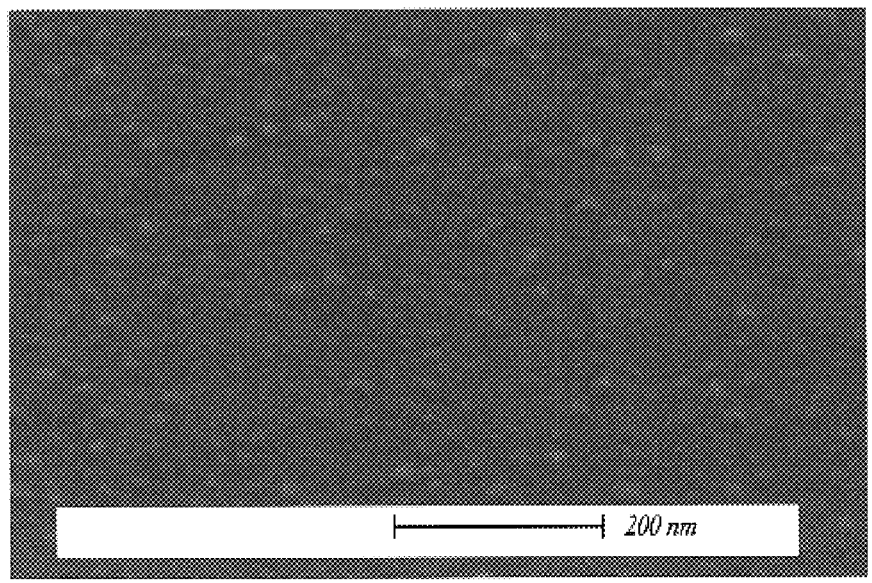
FIG. 4 shows a SEM micrograph of a substrate on which silicon nanodots are formed according to an exemplary process.

The surface of this exemplary sample, after silicon nanodot formation and prior to nitridation, was studied by scanning electron microscopy (SEM) and is shown in FIG. 4. The resulting average nanodot size was 6 nm. It will be clear to one of skill in the art that the size of the nanodots can easily be adjusted by adjusting the deposition time or seed time.

The nitridation was performed in an Epsilon® cold wall single wafer reactor, (ASM America, Inc., Phoenix, Ariz.). The temperature was 450° C., the pressure was 1 Torr, the nitrogen flow was between about 10 slm and about 16 slm. A microwave radical generator, commercially available under the trade name TRW-850 (Rapid Reactive Radicals Technology (R3T) GmbH, Munich, Germany), applying a power of 1000 Watts, was used to generate the nitrogen radicals. The nitrogen radical exposure time was 5 minutes.

Having thus described the preferred embodiments, those of skill in the art will readily appreciate that other embodiments may be made and used within the scope of the claims hereto attached. Numerous advantageous of the embodiments covered by this document have been set forth in the foregoing description. It will be understood, however, that this disclosure is, in many respects, only illustrative. Changes may be made in details, particularly in matters of shape, size, and arrangement of parts without exceeding the scope of the invention.

We claim:

1. A method for the formation of silicon nitride nanodots on a semiconductor substrate, the method comprising the steps of:
   forming silicon nanodots on the semiconductor substrate; and
   nitriding the silicon nanodots by exposing the silicon nanodots to a nitrogen containing gas.

2. The method according to claim 1, wherein the nitrogen containing gas comprises atomic nitrogen.

3. The method according to claim 1, wherein the nitrogen containing gas is provided through a remote radical generator upstream of a process chamber housing the substrate.

4. The method according to claim 3, wherein nitriding comprises providing nitrogen gas through the remote radical generator.

5. The method according to claim 1, wherein the silicon nanodots are formed using a chemical vapor deposition seed technique.

6. The method according to claim 5, wherein the chemical vapor deposition seed technique is conducted within a batch furnace.

7. The method according to claim 5, wherein the chemical vapor deposition seed technique is conducted at between about 0.001 mTorr and 1 Torr.

8. The method according to claim 7, wherein the chemical vapor deposition seed technique is conducted at between about 0.001 mTorr and 100 mTorr.

9. The method according to claim 5, wherein nitriding the silicon nanodots is conducted within a single wafer reaction chamber.

10. The method according to claim 1, wherein forming the silicon nanodots comprises forming amorphous silicon nanodots.

11. The method according to claim 10, wherein nitriding comprises maintaining the substrate below a crystallization temperature of the silicon nanodots.

12. The method according to claim 1, wherein nitriding comprises maintaining the substrate between about 300° C. and 650° C.

13. The method according to claim 1, wherein the silicon nanodots have an average size between about 1 nm and 100 nm.

14. The method according to claim 1, wherein the silicon nanodots have an average size between about 2 nm and 20 nm.

15. The method according to claim 1, wherein the silicon nanodots cover between about 10% and 50% of an area of the substrate surface.

16. The method according to claim 1, wherein the silicon nanodots cover between about 20% and 40% of an area of the substrate surface.

17. A method for forming a memory device, comprising:
   depositing a discontinuous silicon layer on a substrate; and
   nitriding the discontinuous silicon layer.

18. The method of claim 17, wherein nitriding the discontinuous silicon layer comprises exposing the discontinuous silicon layer to nitrogen radicals.

19. The method of claim 17, wherein depositing the discontinuous silicon layer comprises exposing a silicon oxide layer to a silicon containing gas.

20. The method of claim 17, wherein depositing the discontinuous silicon layer comprises forming amorphous silicon nanodots.

21. The method of claim 20, wherein the amorphous silicon nanodots have an average size between about 1 nm and 100 nm.

22. The method of claim 17, wherein depositing the discontinuous silicon layer comprises covering between about 10% and 50% of the substrate with silicon nanodots.

23. A non-volatile memory device comprising:
   a semiconductor substrate;
   a plurality of silicon nitride nanodots across an area of the substrate, the silicon nitride nanodots having an average size between about 1 nm and 100 nm and covering between about 10% and 50% of the area of the substrate.

24. The device of claim 23, wherein the silicon nitride nanodots have an average size between about 2 nm and 20 nm.

25. The device of claim 23, wherein the nanodots cover about 20% to 40% of the area.

26. The device of claim 23, wherein a core region of at least some of the nanodots has a lower nitrogen concentration than a surface region of the at least some of the nanodots.

27. The device of claim 23, wherein the substrate comprises a layer of silicon oxide underlying the silicon nitride nanodots.

28. An integrated circuit, comprising a substrate having a plurality of silicon nitride nanodots, wherein a core region of at least some of the nanodots has a lower nitrogen concentration than a surface region of the at least some of the nanodots.

29. The integrated circuit of claim 28, wherein the nanodots have a distribution across an area of the substrate characteristic of low pressure chemical vapor deposited silicon.

30. The integrated circuit of claim 29, wherein the nanodots have an average size between about 1 nm and 100 nm and cover between about 10% and 50% of the area of the substrate.

31. The integrated circuit of claim 30, wherein the nanodots have an average size between about 1 nm and 20 nm and cover between about 20% and 40% of the area of the substrate.

32. The integrated circuit of claim 29, further comprising a continuous dielectric layer underlying a group of the nanodots.

33. The integrated circuit of claim 32, wherein the dielectric comprises silicon oxide.

* * * * *